United States Patent
Pavier

(10) Patent No.: US 7,365,423 B2
(45) Date of Patent: Apr. 29, 2008

(54) REDISTRIBUTED SOLDER PADS USING ETCHED LEAD FRAME

(75) Inventor: Mark Pavier, Felbridge (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/788,584

(22) Filed: Apr. 20, 2007

(65) Prior Publication Data

US 2007/0194441 A1 Aug. 23, 2007

Related U.S. Application Data

(62) Division of application No. 11/231,690, filed on Sep. 21, 2005, now Pat. No. 7,235,877.

(60) Provisional application No. 60/612,372, filed on Sep. 23, 2004.

(51) Int. Cl.
*H01L 23/043* (2006.01)

(52) U.S. Cl. .................. 257/708; 257/711; 257/676; 257/728; 257/E23.031; 257/709; 438/121

(58) Field of Classification Search ............... 257/708, 257/E23.031

See application file for complete search history.

(56) References Cited

U.S. PATENT DOCUMENTS 7,078,271 B2 * 7/2006 Mahle .................. 438/123
2006/0012016 A1 * 1/2006 Betz et al. .............. 257/678

* cited by examiner

*Primary Examiner*—Tu-Tu Ho
(74) *Attorney, Agent, or Firm*—Ostrolenk, Faber, Gerb & Soffen, LLP

(57) ABSTRACT

A semiconductor package has a thinned semiconductor die fixed in a shallow opening in a conductive body. The die electrodes at the bottom of the die are plated with a redistributed contact which overlaps the die bottom contact and an insulation body which fills the annular gap between the die and opening. A process is described for the manufacture of the package in which plural spaced openings in a lead frame body and are simultaneously processed and singulated at the end of the process.

8 Claims, 2 Drawing Sheets

REDISTRIBUTED SOLDER PADS USING ETCHED LEAD FRAME

RELATED APPLICATIONS

This application is a division of U.S. patent application Ser. No. 11/231,690, filed Sep. 21, 2005, now U.S. Pat. No. 7,235,877 entitled Redistributed Solder Pads Using Etched Lead Frame which application claims the benefit of U.S. Provisional Application No. 60/612,372, filed Sep. 23, 2004, the entire disclosure of which is incorporated by reference herein.

FIELD OF THE INVENTION

This invention relates to semiconductor devices and more particularly to a process for manufacturing a semiconductor package and the structure of the semiconductor package.

BACKGROUND OF THE INVENTION

Power semiconductor die are well known which have spaced electrodes on a bottom surface, which are to be mounted, as by soldering to conforming metal patterns on a support board such as an FR-4 printed circuit board, or the like. As package size reduces, the electrodes also reduce in area and spacing, thus aggravating electro migration problems in solder contacts; the thermal performance of the device and difficulty of placing the package on the support board with exacting positional tolerance.

FIG. 1, shows a chip-scale semiconductor package 10 according to the prior art which includes a conductive clip (or can) 12 formed from a conductive material such as copper, and a semiconductor device 14, such as a power MOSFET. The package 10 is sold by the International Rectifier Corporation under the trade mark Direct FET®.

Semiconductor device 14 includes a first electrode 16, which is connected by, for example, solder, conductive epoxy or the like to the interior surface of clip or can 12. Semiconductor device 14 further includes another electrode 18 on an opposing surface thereof which is adapted for electrical connection by solder, conductive epoxy or the like to a respective conductive pad on a circuit board. Semiconductor 14 may also include a control electrode 20 adjacent electrode 18 which is also adapted for electrical connection in a manner similar to electrode 18. Further detail regarding a semiconductor package according to prior art can be found in U.S. Pat. No. 6,624,522, which is assigned to the assignee of the present application.

Semiconductor device 14, may be a power MOSFET die and electrodes 16, 18 and 20 are its, drain, source and gate electrodes, respectively. The flange of can 12, which is at the potential of source electrode 16, and contacts 18 and 20 terminate in a common plane to facilitate their connection to the matching pads on a receiving board surface.

As the device size reduces, the areas and spacing of contacts 18, 20 and the flange of can 12 reduce, reducing thermal performance and increasing the danger of shorting the electrodes through solder-bridging growth of dendrites. Reduced pad areas are also more susceptible to electromigration. In this case, solder may migrate, creating voids in the solder joint and increased joule heating and the risk of open circuit failures.

A device such as the one shown by FIG. 1 is usually manufactured by first stamping or punching clip (or can) 12 out of a conductive material, and then placing semiconductor device 14 therein using, for example, a pick and place method.

BRIEF DESCRIPTION OF THE INVENTION

The present invention concerns a novel method for manufacturing a new-chip-scale package similar to the one shown in FIG. 1 with additional features which enhance the characteristics of the package. In particular, singulated thin die are placed in etched depressions in a conductive frame, which will become the device frame. The die electrodes will have predeposited copper electrodes on their bottom surfaces, and, after securement of their top electrode to the base of the depression, the open surface is overmolded to encapsulate the die within the openings and then ground flat to expose the bottom pads. Additional contacts are then plated with plate areas which overlap the bottom dielectric, thus redistributing the contact pads. A solderable metal is then applied to the pads, and the die/packages are singulated.

Other features and advantages of the present invention will become apparent from the following description of the invention which refers to the accompanying drawings.

DETAILED DESCRIPTION OF THE INVENTION

Figure 1:
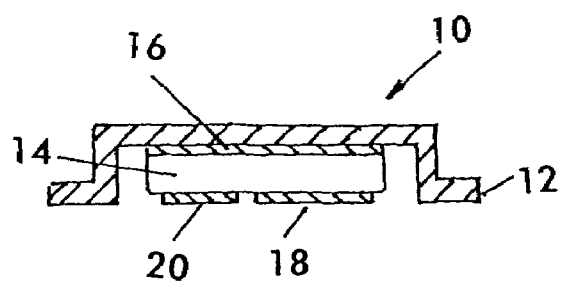
FIG. 1 shows a cross-sectional view of a semiconductor package according to prior art.
Figure 2A:
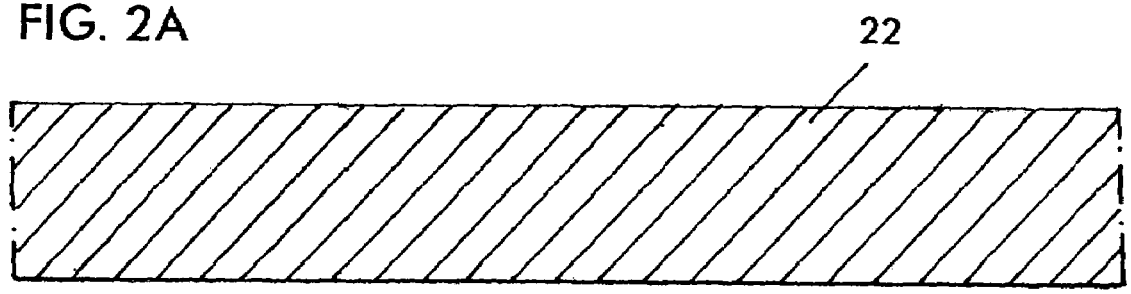
FIGS. 2A-2F schematically illustrate certain selected steps in a manufacturing method according to the present invention.
Figure 2B:
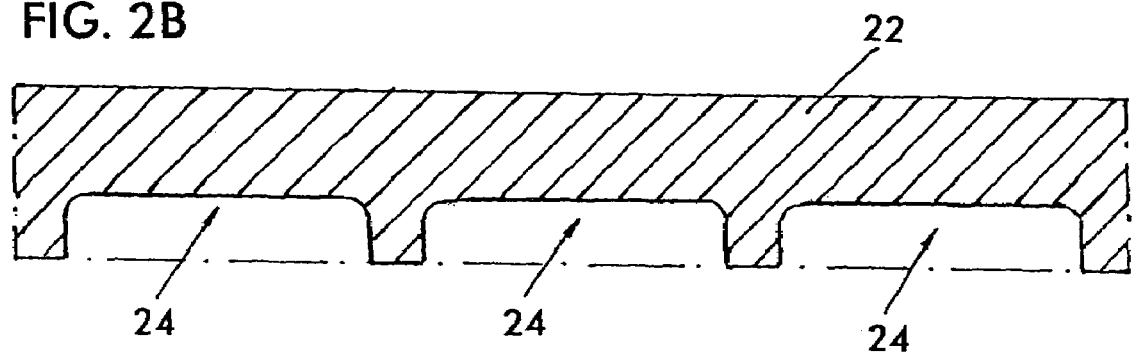

Referring to FIGS. 2A-2B, in a method according to the present invention, first, a plurality of spaced depressions 24 are formed in a conductive lead frame body 22 by, for example, etching. Body 22 may be a copper or the like. Each depression 24 so formed is wide enough and deep enough to receive a thinned semiconductor die, such as a power MOSFET die.

Figure 2C:
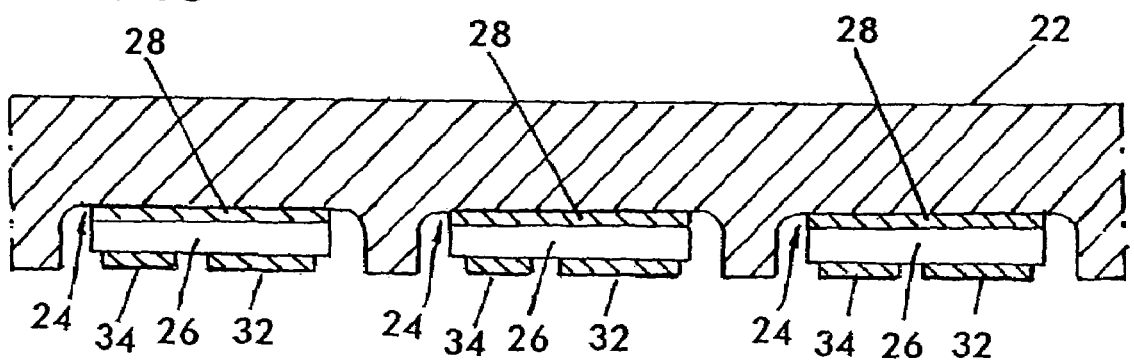

Referring next to FIG. 2C, a power MOSFET die 26 is disposed inside each depression 24 in lead frame body 22. In the preferred embodiment of the present invention, the drain electrode 28 of each power MOSFET 26 is electrically and mechanically attached to the inner surface of a respective depression 24 by solder, conductive epoxy or the like. The MOSFET die 26 is preferably thinned, for example, to less than about 100 microns and to slightly less than the depth of depression 24.

Figure 2D:
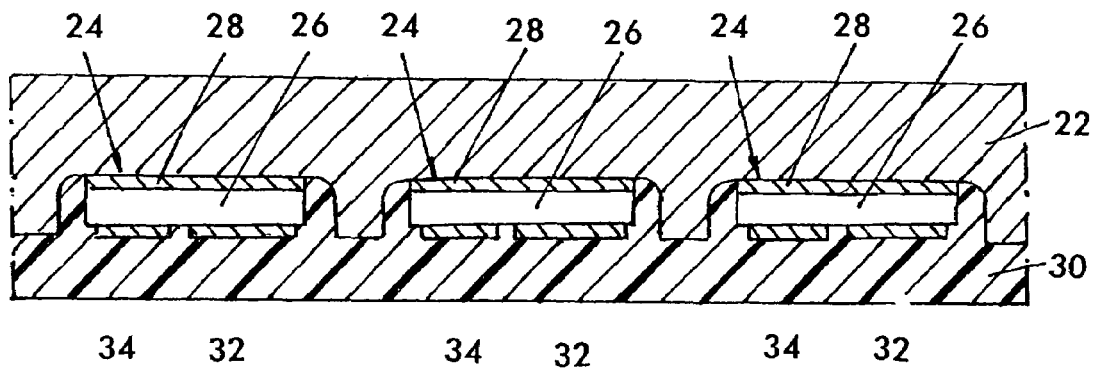
Figure 2E:
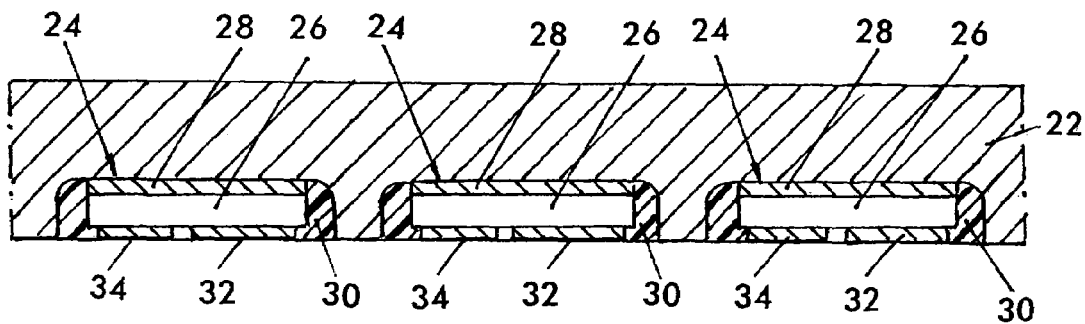

Referring next to FIG. 2D, an insulation material 30, such as a dielectric epoxy, is formed over power MOSFETs 26 and inside depressions 24 in lead frame body 22. Thereafter, as shown by FIG. 2E, insulation material 30 is removed by grinding, etching or the like to reveal or expose source electrodes 32 and gate electrodes 34 of power MOSFETs 26.

Figure 2F:
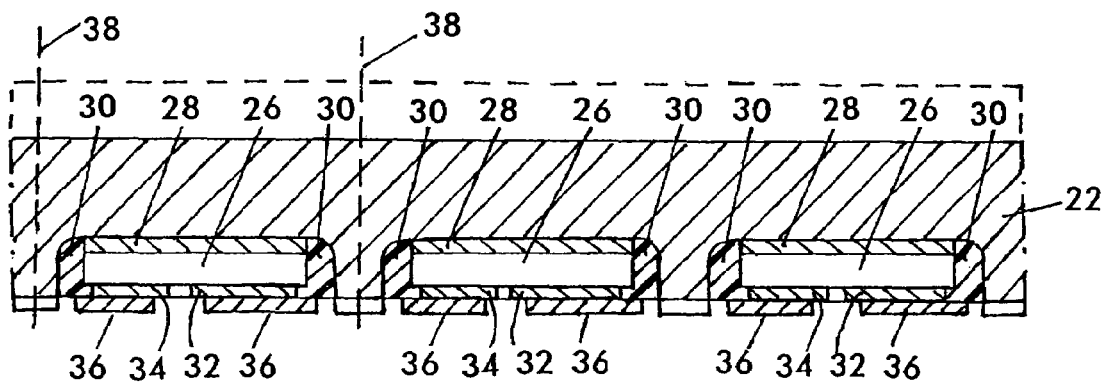
Figure 3:
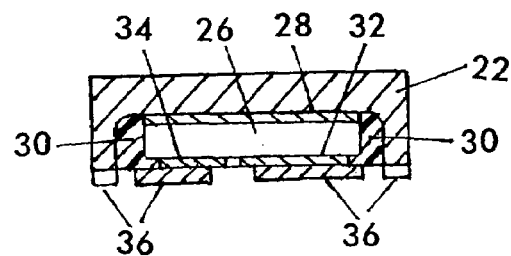
FIG. 3 shows a cross-sectional side view of a package manufactured according to the present invention.

If a thinner final device height is required, a top portion of lead frame body 22 (portion shown by broken lines) may be removed by grinding or the like in order to planarize the upper surface thereof as shown by FIG. 2F. Thereafter, solder contacts 36 (preferably of copper) are formed by plating and etching preferably on source electrodes 32 and gate electrodes 34, and made solderable by application of solderable metal thereto. Note that the contacts 36 overlap onto the bottom of insulation 30 and are redistributed in position and area relative to contacts 32 and 34. Next, individual packages are obtained by sawing lead frame body 22 along saw lines 38 to obtain a package such as the one shown by FIG. 3.

In a preferred embodiment, the electrodes of power MOSFETs 26 may have copper pre-deposited thereon.

Further, in a preferred embodiment lead frame body 22 may be 0.25 mm thick, and power MOSFETs 26 may be about 100 μ or less.

It should be noted that plated solderable contacts 36 are preferably extended over insulation material 30 remaining in depressions 24.

Advantages of plated solderable contacts 36 are better electromigration characteristics, better thermal performance, and increased availability of area for soldering the package down to a circuit board.

Alternatively, starting with the structure shown by FIG. 2C, the front face is coated with a photoimageable dielectric material, such as a photoimageable epoxy. Next, openings are formed in the photoimageable dielectric to expose gate electrodes 34 and source electrodes 32. Next, contacts 36 are formed by plating individual contacts on each electrode 32, 34 or by plating the entire surface of the package and then etching contacts 36 out of the plate. Then, a solderable finish such as Ni Au, or Ag is applied to contacts 36.

The alternative process can eliminate the cost of die plating. It could also reduce grid shapes etc.

Alternatively die 26 in FIG. 2C may be a lateral device, such as a III-nitride device. In this case the die may be mechanically connected to the inner surface of the depression 24 by solder or conductive adhesive.

In a further embodiment of the invention, two devices, such as a lateral power device and a controller IC may be attached to the inner surface of depression 24 by electronically conductive or insulating adhesive. In this embodiment, electrodes on the lateral power die may be connected to the controller die using plated tracks.

In all of the above cases, a solder mask material may be applied, overlapping adjacent electrodes and partially exposing redistributed solderable contacts. This material prevents solder bridging of the electrodes on the die during subsequent board assembly processes. The solder mask material may be a photoimageable epoxy or the like.

Devices may also be singulated from the final assembly using stamping, laser ablation or water jet cutting.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A process for the manufacture of a semiconductor package comprising the steps of:

forming a shallow opening in a conductive lead frame body, with the bottom of said opening lying in a plane parallel to the plane of the surface of said body;

conductively and mechanically fixing the top electrode of a semiconductor die to the bottom of said opening, with the bottom electrode of said die being coplanar with said surface of said body, and with the periphery of said die spaced from the surrounding walls of said opening;

filling the annular space between the periphery of said die and the walls of said opening with an insulation material and planarizing the exposed surface of said insulation material with said surface of said body and exposing said bottom electrode of said die;

and thinning the top side of said conductive body opposite to the said receiving said opening.

2. The process of claim 1, which includes the further step of copper plating said bottom electrode and the bottom surface of said conductive body adjacent said opening.

3. The process of claim 1, which includes the further step of applying a redistributed contact to said bottom contact which overlaps onto the bottom surface of said insulation material.

4. The process of claim 2, which includes the further step of applying a redistributed contact to said bottom contact which overlaps onto the bottom surface of said insulation material.

5. The process of claim 1, wherein a plurality of said shallow openings are laterally displaced from one another and each receive a respective semiconductor die and are filled with said insulation material, thereby simultaneously to form plural die and housing assemblies; and thereafter singulating said die and housing assemblies.

6. The process of claim 2, wherein a plurality of said shallow openings are laterally displaced from one another and each receive a respective semiconductor die and are filled with said insulation material, thereby simultaneously to form plural die and housing assemblies; and thereafter singulating said die and housing assemblies.

7. The process of claim 3, wherein a plurality of said shallow openings are laterally displaced from one another and each receive a respective semiconductor die and are filled with said insulation material, thereby simultaneously to form plural die and housing assemblies; and thereafter singulating said die and housing assemblies.

8. The process of claim 4, wherein a plurality of said shallow openings are laterally displaced from one another and each receive a respective semiconductor die and are filled with said insulation material, thereby simultaneously to form plural die and housing assemblies; and thereafter singulating said die and housing assemblies.

* * * * *